United States Patent
Oldenburg et al.

(10) Patent No.: US 6,623,280 B2
(45) Date of Patent: Sep. 23, 2003

(54) DUAL COMPLIANT PIN INTERCONNECT SYSTEM

(75) Inventors: Glenn Ray Oldenburg, Rochester, MN (US); Barry Lee Shepherd, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/008,191

(22) Filed: Nov. 13, 2001

(65) Prior Publication Data

US 2003/0092296 A1 May 15, 2003

(51) Int. Cl.[7] .................................................. H01R 9/09
(52) U.S. Cl. ........................................ 439/75; 439/590
(58) Field of Search ............................... 439/75, 83, 78, 439/590, 937, 80, 87, 862, 891, 637, 82, 751, 74

(56) References Cited

U.S. PATENT DOCUMENTS

| | | | |
|---|---|---|---|
| 5,078,612 A | * | 1/1992 | Rozmus .......................... 439/84 |
| 5,518,427 A | * | 5/1996 | Kan et al. ..................... 439/736 |
| 5,761,050 A | * | 6/1998 | Archer ......................... 361/791 |
| 6,042,423 A | * | 3/2000 | Murr et al. ................... 439/590 |
| 6,077,128 A | * | 6/2000 | Maag et al. ................... 439/751 |
| 6,309,228 B2 | * | 10/2001 | Otsuki et al. ................... 439/84 |

FOREIGN PATENT DOCUMENTS

| | | | | |
|---|---|---|---|---|
| EP | 0584902 A1 | * | 2/1994 | ............... 439/75 |
| JP | 63-301473 | * | 12/1988 | ............... 439/75 |

* cited by examiner

*Primary Examiner*—P. Austin Bradley
*Assistant Examiner*—Phuongchi T Nguyen
(74) *Attorney, Agent, or Firm*—Robert W. Lahtinen

(57) ABSTRACT

A connector for effecting a permanent, solderless connection between two printed circuit boards or other devices using plated through via openings is disclosed. The connector body captures pins that project from two surfaces thereof. Each of a plurality of pins presents dual compliant connecting portions, one adjacent each body surface from which the pin projects. The connector body portion may also include bosses adjacent the projecting pins to cause the pin compliant connecting portion to have a predetermined distance of penetration into the cooperating via opening of a connected board or panel and the edge surface of the body can be notched between pin locations to enable an extended length to be partitioned into smaller units. The connector may also be formed with two spaced body portions to effect greater separation between attached boards.

4 Claims, 11 Drawing Sheets

DUAL COMPLIANT PIN INTERCONNECT SYSTEM

FIELD OF THE INVENTION

This invention pertains to compliant connectors and more particularly to dual compliant connectors for interconnecting apparatus such as two printed circuit boards.

BACKGROUND OF THE INVENTION

Compliant connector pins provide a permanent or one time, solderless connection to a printed circuit board (PCB) by being deformed upon insertion into a plated via opening to establish a reliable, high pressure contact.

Compliant connectors take many forms, usually by reconfiguring a portion of the pin to cause it to project beyond the normal periphery of the pin or by the addition of a sleeve that extends beyond the pin periphery and is compressible to form the high pressure electrical connection. The common operation is that the pin is readily received in the via opening, but the compliant portion must deform to produce the permanent, high pressure electrical connection.

It is frequently desired to create a permanent, solderless connection between printed circuit boards in circumstances where commercial soldering techniques are impractical or not usable. An example of such an environment is the use of multiple card portions to form an irregularly shaped card, while making optimum use of the panel members from which the card or backplane is fabricated. It is also frequently required that multiple cards be used and interconnected when the using device provides only an irregular confined volume to accommodate the electronic functions.

SUMMARY OF THE INVENTION

The compliant connector of the present invention uses a pin with dual compliant portions for establishing an interconnection between two printed circuit boards. The connector includes an intermediate molded body portion that captures and retains the multiple pins in a predetermined configuration with a compliant connecting portion adjacent each molded body portion surface from which the pin protrudes. To maintain correct positioning and a positive orientation, the pins are formed with tabs or another irregular structural formation in the pin portion that is captured in the molded body portion. The molded body portion may further include abutment projections adjacent the pins to engage the surface of a printed circuit board assembled to the connector and thereby determine the positioning of the connector pin compliant connector portions within the cooperating printed circuit board via openings. The separation between the connected printed circuit boards is determined by the thickness of the molded body portion. Another modification is the provision of notched indentations in the body portion side portion surfaces to permit the connector to be formed in extended lengths and separated to create a connector with a desired number of pins.

When greater separation is required, the body portion can be formed as two separate parts with elongated pins extend through and between both to increase the spacing between printed circuit board attachment locations.

Another variation that can be incorporated in connectors using the present invention is the use of larger and smaller pins. Larger pins could accommodate power applications and smaller pins could be utilized for high density signal applications.

DETAILED DESCRIPTION

Figure 1:
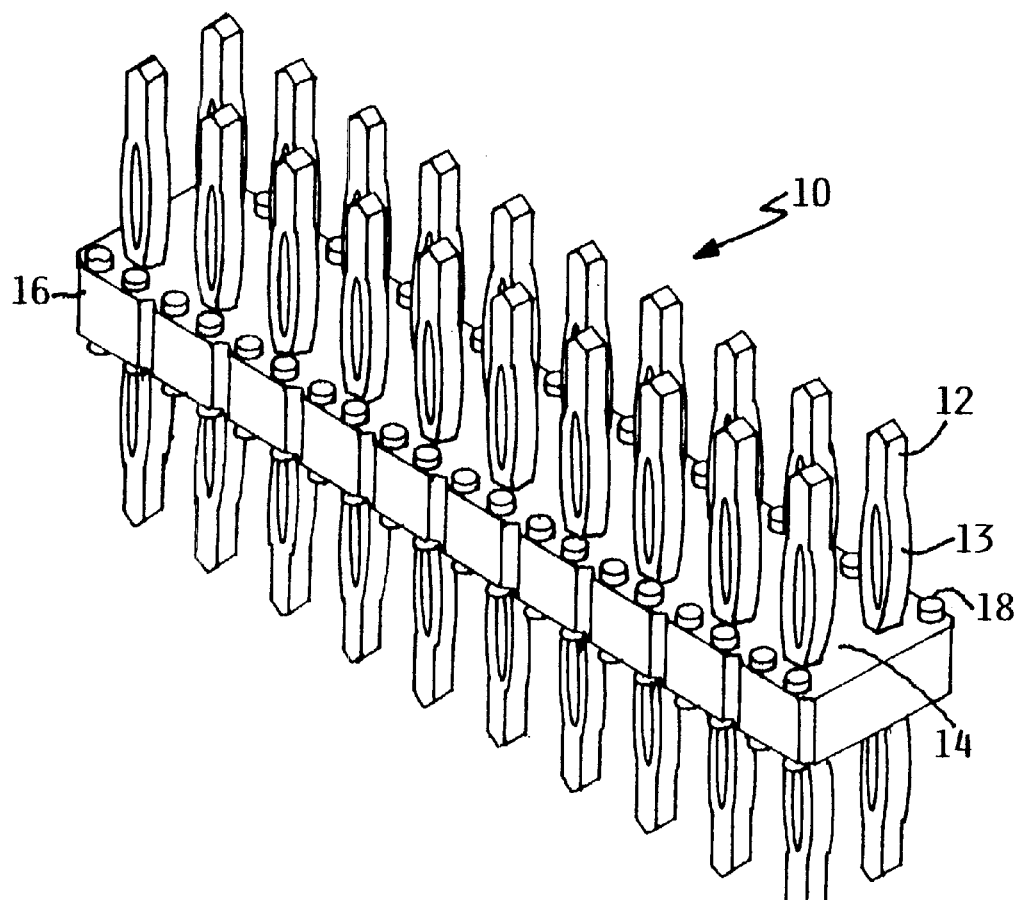
FIG. 1 is an isometric view of the dual compliant pin connector of the present invention.
Figure 2:
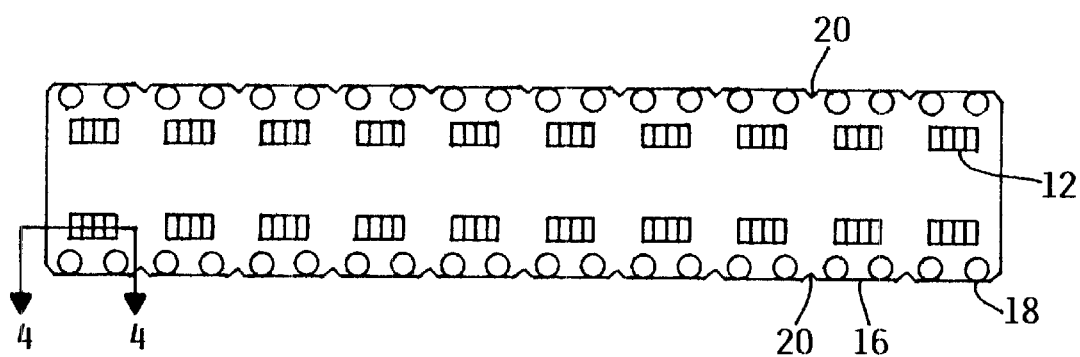
FIG. 2 and FIG. 3 are respectively a plan view and an end elevation of the connector illustrated in FIG. 1.
Figure 3:
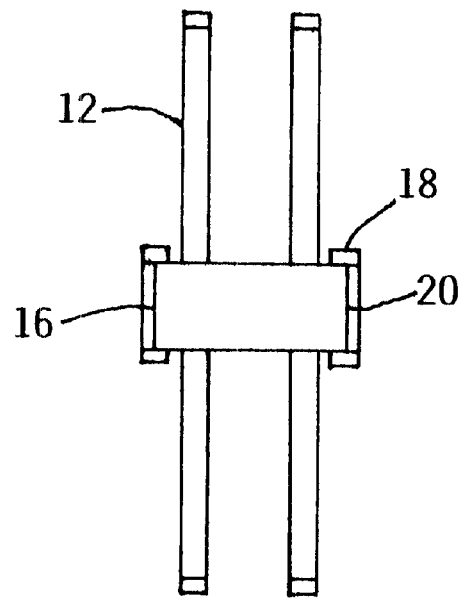

Referring to the drawings, FIGS. 1 through 4 illustrate the dual compliant connector 10 of the present invention. Although there are numerous designs of compliant connectors, the connectors shown and described utilize a common form of such a connector wherein the pin stock is sheared and separated. The compliant portion is formed by centrally shearing the pin and displacing material on opposite sides of the shear line in opposite directions from the line of shearing. The displaced material adjoining the shear line projects beyond the undeformed periphery of the pin such that when the pin is inserted into a cylindrical opening, such as a via through a printed circuit board, the pin portion having the original peripheral dimensions is readily received and the pin portion where material has been displaced, adjacent the shear line, forms an interference fit with the surrounding cylindrical plated via surface. The same compliant pin configuration may be obtained by stamping the pin from sheet material with the enlarged, apertured compliant section and thereafter coining the stamped part to obtain the desired finish conditions.

Figure 4:
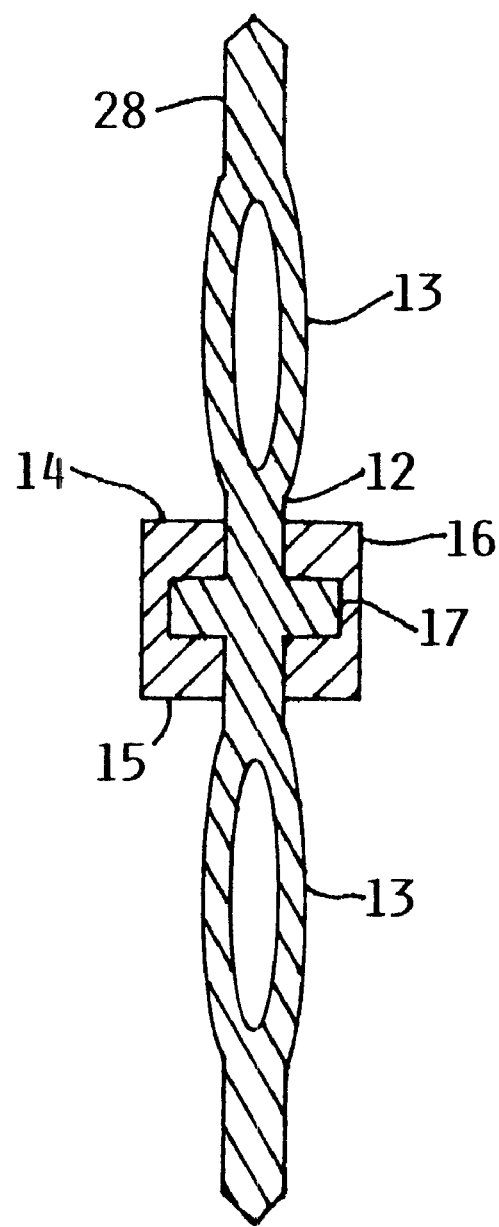
FIG. 4 is a vertical section, taken along line 4—4 of FIG. 2, of a dual compliant pin including a central tab which is formed by upsetting material of the pin and secures the pin in the molded body portion.

FIG. 1 shows an assembled twenty pin dual complaint pin connector 20. Each of the pins 12 has a sheared and expanded complaint connection portion 13 adjacent each surface of the body portion 16 from which it projects. The body 16 may be molded about the pins 12, each of which has a central tab portion 17, as seen in FIG. 4, which is upset from the pin material and forms an irregular structural portion which enables the molded body 16 to capture and retain the pin and maintain pin alignment. As illustrated in the isometric view of FIG. 1, plan view of FIG. 2 and end view of FIG. 3; the body portion 16 includes bosses 18 adjacent each pin 12 which abut the PC board, when assembled to the connector, to determine the distance that compliant connector portions 13 penetrate cooperating plated vias.

An alternative method of connector fabrication could be effected by molding the connector body separately and thereafter inserting the dual compliant pins using automated pin stitching equipment for a cost effective assembly process.

The body 16 has a notch 20 at each side between each side by side pair of pins 12. This enables connectors to be fabricated in extended lengths and separated at any notched location to form a connector with any number of dual compliant pins.

Figure 5:
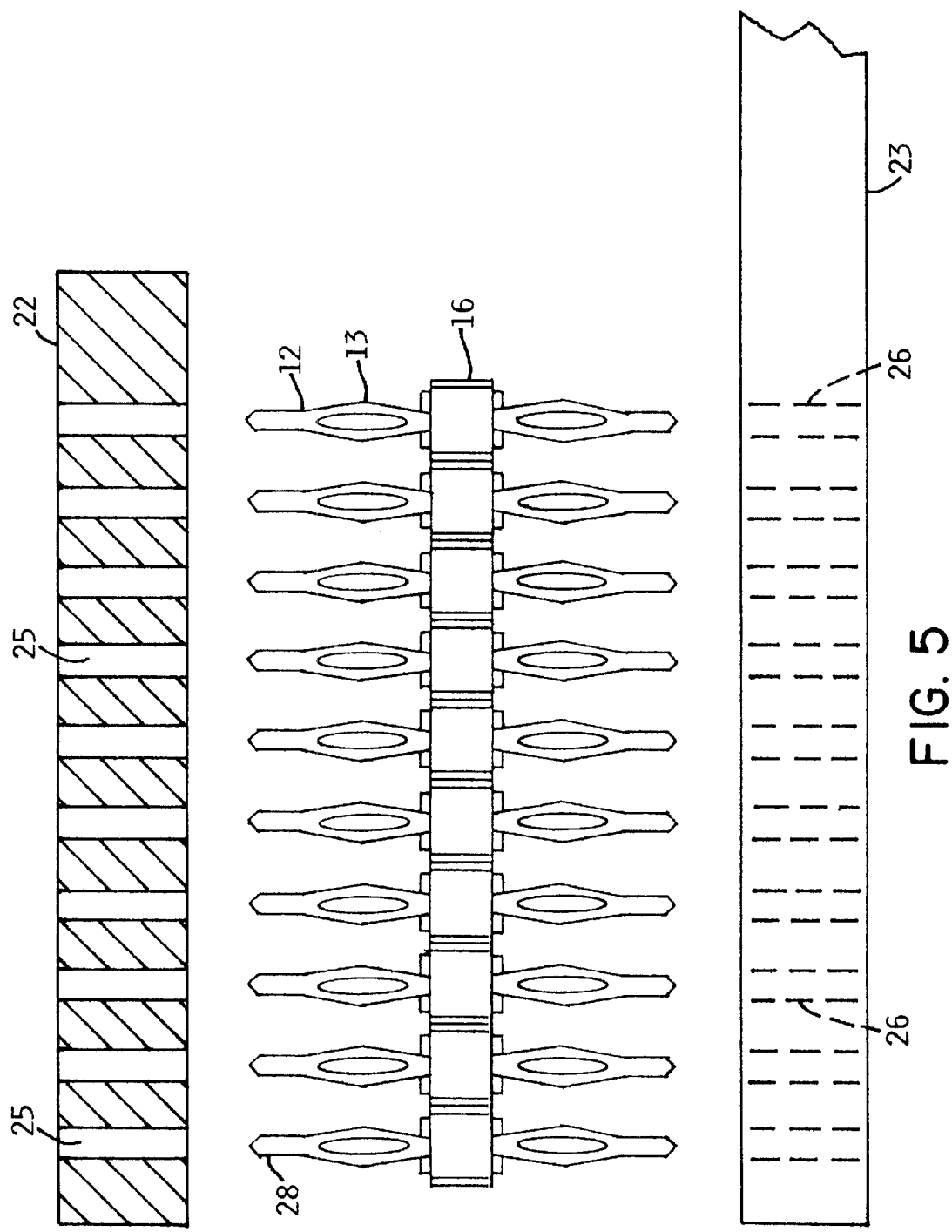
FIG. 5 shows a side elevation of the connector of FIG. 1 with a sectioned upper printed circuit board and a lower printed circuit board, each of which presents vias aligned with the connector compliant pins.

FIG. 5 is a side elevation of the twenty dual compliant pin connector 10 of FIG. 1 aligned with PC boards 22 and 23 to which it is to be connected. The upper PC board 22 is shown in section through a row of plated via openings 25 which are respectively aligned with the upper portions of compliant connecting pins 12 and the lower PC board 23 has the plated vias 26 aligned with the lower compliant connection portions of pins 12. The thickness of the body 16, including the bosses 18 projecting from the opposite body surfaces 14 and 15 determines the separation between the PC boards 22 and 23 which are interconnected by the connector 20.

When the connector 10 is attached to the PC board 22, the unmodified terminal ends 28 of the pins 12 are readily received in the plated via openings 25, but the compliant connector portions 13 exceed the diameter of the plated via openings 25 and are compressed during insertion to form a high pressure electrical connection with the plated via surface. When the PC board 22 abuts the connector bosses 18, the compliant sections 13 are substantially centered within the cooperating vias 25 to optimize the electrical connections.

Figure 6:
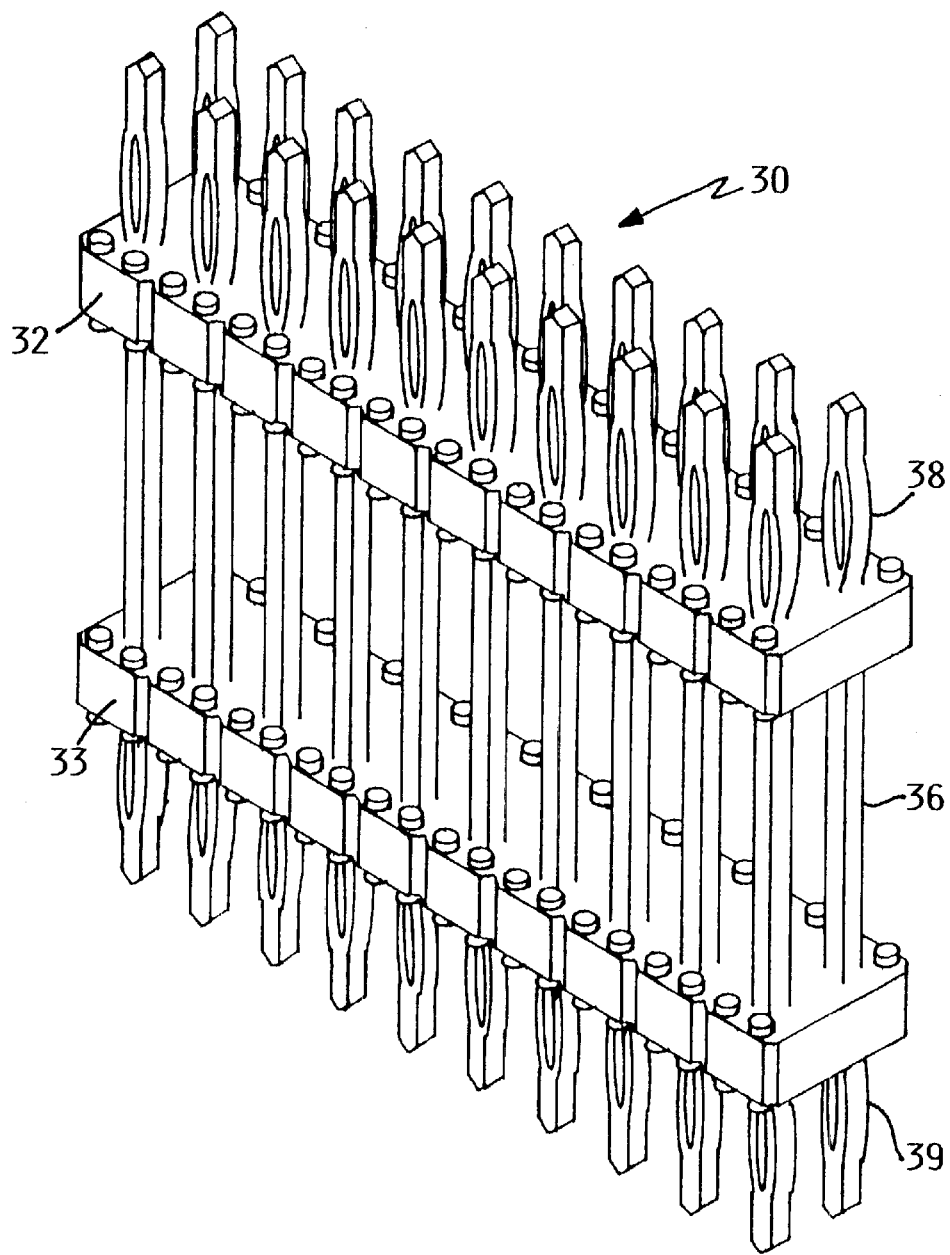
FIG. 6 is an isometric view of a second embodiment of the connector of FIG. 1 using separated body portions to effect greater separation between devices interconnected by the connector.
Figure 7:
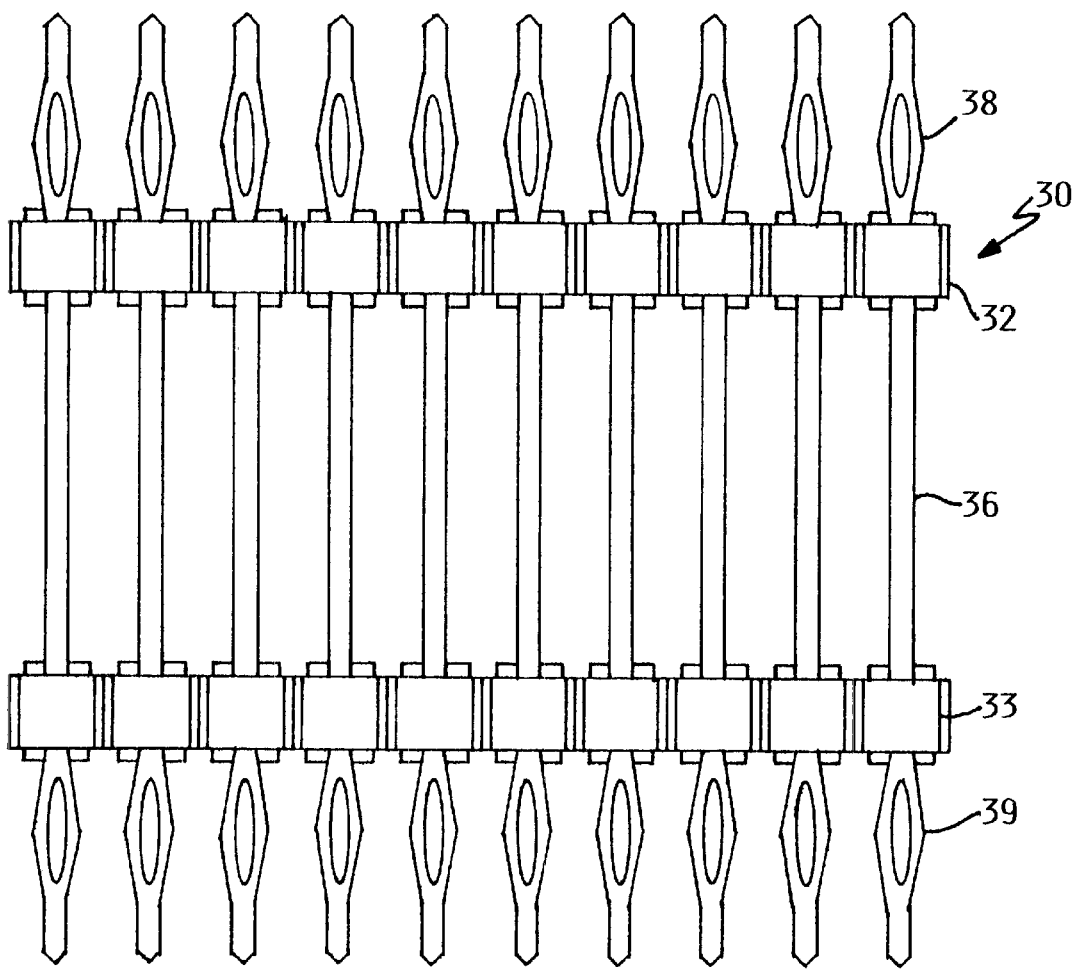
FIG. 7 and FIG. 8 are respectively side and end elevations of the connector of FIG. 6.
Figure 8:
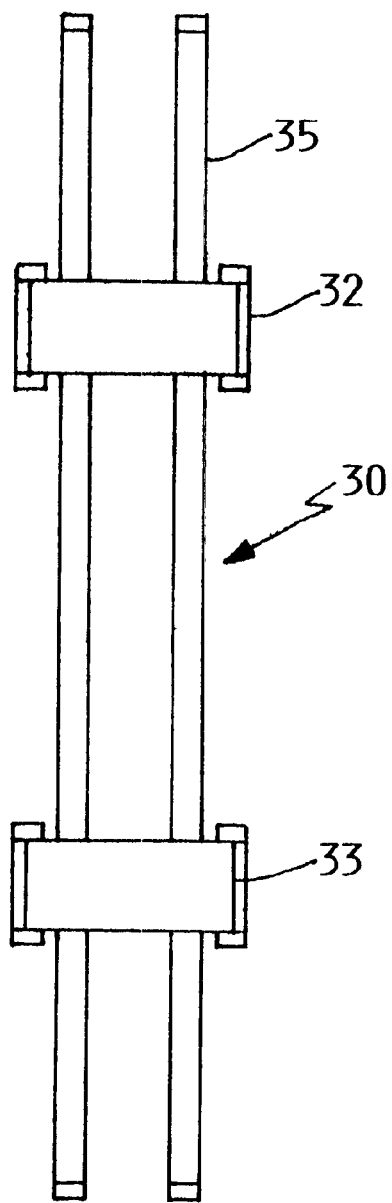

The height of connector body 16 of FIG. 1 including the bosses 18 determines the separation between connected PC boards. When greater PC board separation is required, a connector 30 may be fabricated using separate body portions 32 and 33, as illustrated by the dual compliant pin connector of FIGS. 6, 7, and 8. Here, each pin 35 has an elongated central portion 36 and is captured by the separate connector body portions 32 and 33 respectively adjacent the compliant pin connector portions 38 and 39 to limit connector pin penetration into a cooperating via opening and optimize the electrical connection. The central pin portions 36 extending between the body portions 32 and 33 may be coated with an electrically insulating material to avoid a shorting condition if inadvertently subject to contact with a conductive element. An alternative structure would be the formation of the connector of FIGS. 6, 7 and 8 using a single body element including the body portions 32 and 33 and the space between to wholly encapsulate the pins between the compliant connector portions 38 and 39.

Figure 9:
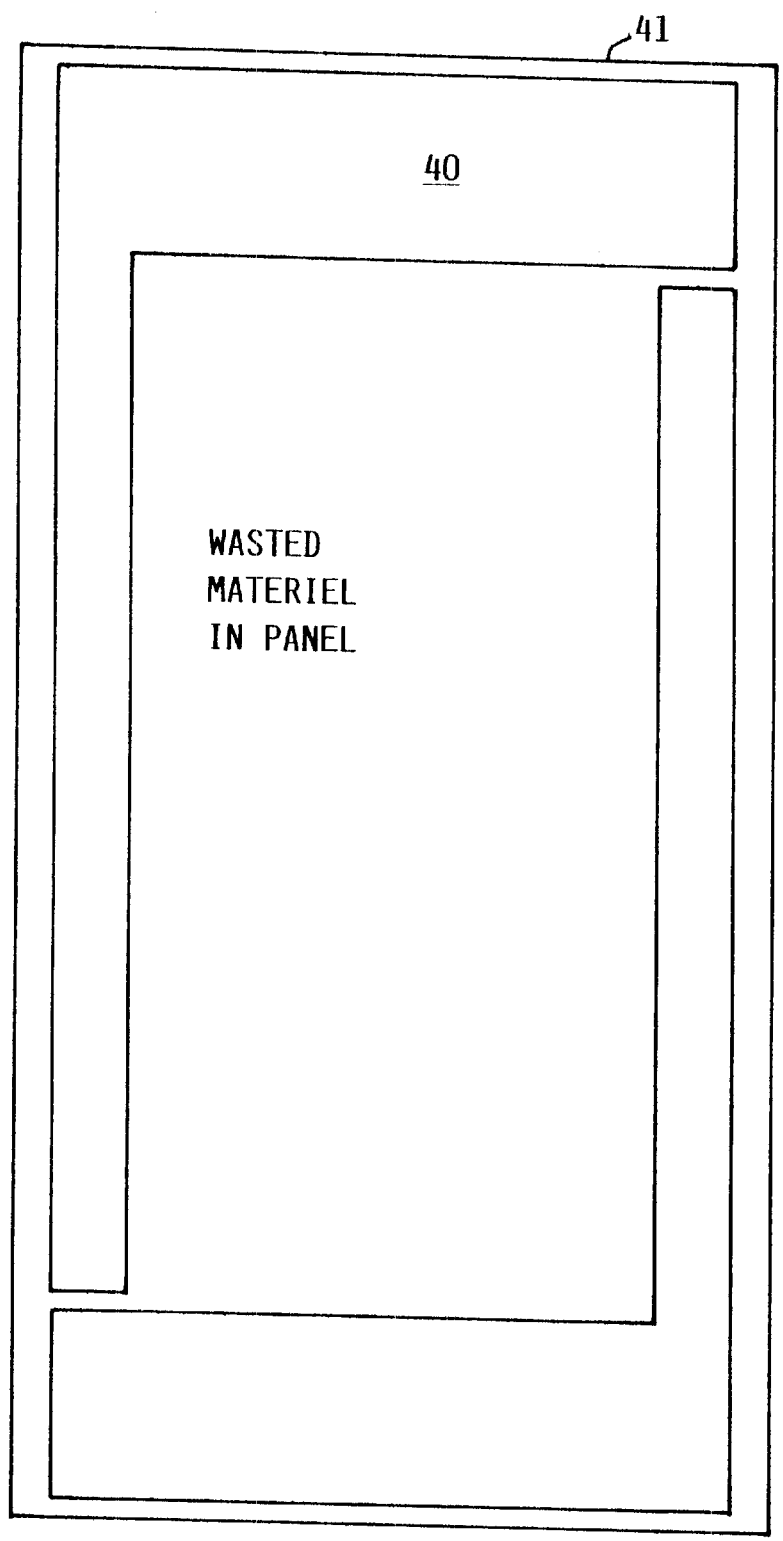
FIG. 9 illustrates the layout of an irregularly shaped printed circuit board on a standard panel.
Figure 10:
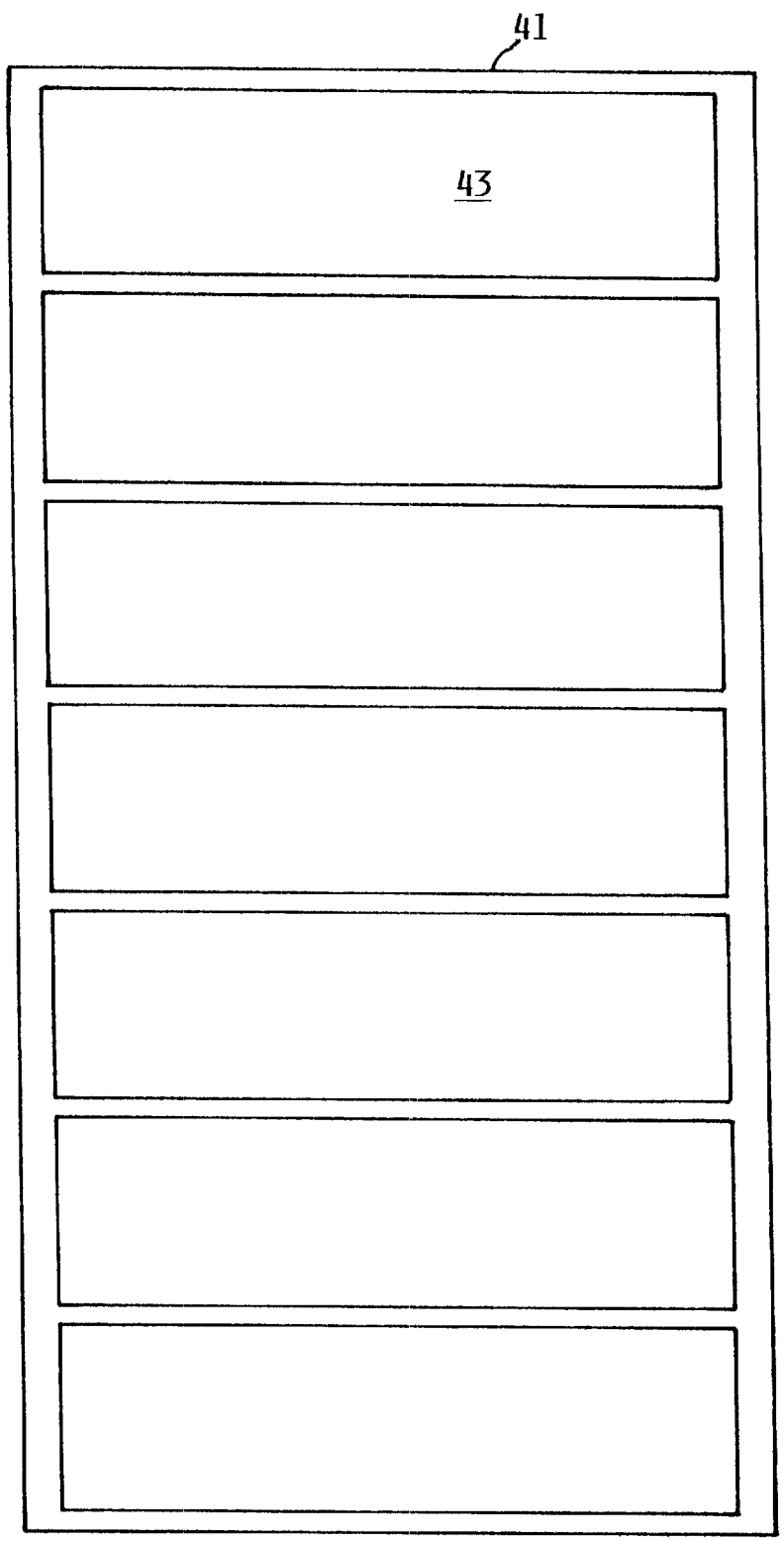
FIGS. 10 and 11 show the printed circuit board of FIG. 9 partitioned into two parts which are subsequently connected, to make more complete use of the panels.
Figure 11:
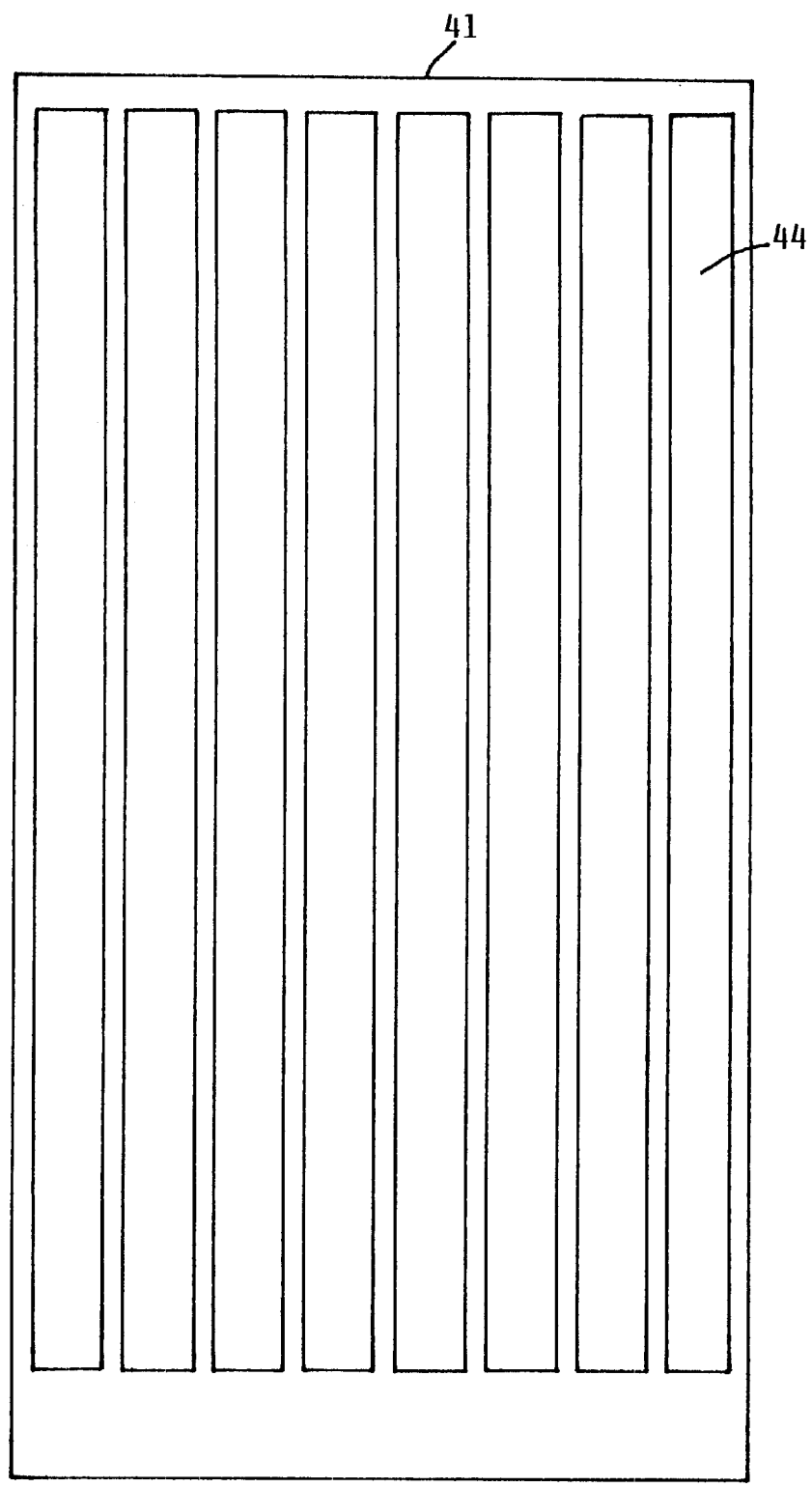

The dual compliant pin connector of the present invention may be used to interconnect PC boards in environments where multiple boards are required to utilize an irregular volume available within the using device. Another environment wherein connected PC boards have substantial utility is illustrated in FIGS. 9, 10, and 11. The need often arises in system design to create irregular shaped backplanes and cards. Since the panels 41 from which the cards are formed come in only certain sizes, these irregular shapes result in added costs due to poor panel utilization. FIG. 9 shows a PC board 40 with an irregular configuration that can not be laid out to make effective use of panels 41 during fabrication. By partitioning the board into two portions 43 and 44 (FIG. 10 and FIG. 11) during fabrication and thereafter permanently interconnecting the portions, using the dual compliant connectors described above, to form the desired configuration, optimum use of panel real estate may be realized during fabrication.

The foregoing description of embodiments of the invention has been presented for purposes of illustration and description. It is not intended to be exhaustive or limit the invention to the precise form disclosed. Many modifications and variations are possible in light of the above teaching. It is intended that the scope of the invention be limited not by the description and illustrations, but rather by the claims appended hereto.

What is claimed is:

1. A connector for attaching a first member with plated through holes or vias to second member which includes plated through holes or vias comprising a generally planar body portion;

a plurality of pins substantially parallel to one another which are captured and retained by said body portion and project from opposite sides of said body portion;

said body portion comprising an electrically insulating material molded about said plurality of pins with each of said plurality of pins including an irregular tab structure within said molded body portion causing said to be captured and retained by said body portion;

dual compliant connecting portions carried by each of said plurality of pins which are axially spaced to form a pair of coplanar fields of compliant connecting portions adjacent said opposite sides of said body portion and adapted to be received respectively by the vias of said first member and said second member to electrically connect such members; and bosses formed as a part of said body portion and extending from the body portion opposite surfaces form which said pins project whereby, when said first and second members are assembled to said connector, said bosses limit the penetration of said pins into said first and second member vias to place said compliant connecting portions at a predetermined position within said vias.

2. The connector of claim 1 wherein said body portion comprises two generally planar portions that are molded about said plurality of pins and spaced apart to provide greater separation between said first and second planar members when assembled to said connector.

3. A connector for electrically interconnecting and retaining first and second planar members at plated via openings therein comprising a generally planar body portion;

a plurality of substantially parallel pins which project through said body portion and extend from opposite sides of said body portion;

said body portion comprising an electrically insulating molded about said plurality of pins with each of said pins possessing irregular tab structure within said molded body portion causing such pins to be captured and retained by said body portion;

a pair of compliant connector portions presented by each of said pins and disposed respectively adjacent said opposite sides of said body portion, whereby the projecting pins and compliant connector portion at one side of said body portion may be received in the via openings of said first planar member and the projecting pins and compliant connector portions at the side of said body portion opposite said one side may be received in the via openings of said second planar member; and bosses formed as a part of said body portion which extend from the surface from which said pins extend with thecompliant connector portions adjacent the surface whereby, with said first and second planar members assembled to said connector abutting said bosses, the penetration of said pins into said via openings is limited to place said pin compliant connector portions at a predetermined position within the planar member vias.

4. The connector of claim 3 wherein said body portion comprises two generally planar portions that are molded about said plurality of pins and spaced apart to provide greater separation between said first and second planar members when assembled to said connector.

* * * * *